(12) United States Patent
Liu

(10) Patent No.: US 11,320,464 B2
(45) Date of Patent: May 3, 2022

(54) CHIP PACKAGE

(71) Applicants: Kabushiki Kaisha Toshiba, Tokyo (JP); Toshiba Electronic Devices & Storage Corporation, Tokyo (JP)

(72) Inventor: Jia Liu, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/018,006

(22) Filed: Sep. 11, 2020

(65) Prior Publication Data
US 2021/0223293 A1    Jul. 22, 2021

(30) Foreign Application Priority Data

Jan. 22, 2020 (JP) .............................. JP2020-008083

(51) Int. Cl.
*G01R 15/20* (2006.01)
(52) U.S. Cl.
CPC .......... *G01R 15/207* (2013.01); *G01R 15/202* (2013.01)
(58) Field of Classification Search
CPC ..................... G01R 15/207; G01R 15/202
See application file for complete search history.

(56) References Cited

U.S. PATENT DOCUMENTS

| 9,638,767 | B2 * | 5/2017 | Nomura | G01R 33/09 |
| 2008/0087995 | A1 * | 4/2008 | Yang | H01L 24/50 257/676 |
| 2011/0285384 | A1 * | 11/2011 | Nomura | G01R 15/205 324/117 R |
| 2019/0346514 | A1 * | 11/2019 | Deak | G01R 33/09 |

FOREIGN PATENT DOCUMENTS

| JP | 2001-339109 A | 12/2001 |
| JP | 2007-147460 A | 6/2007 |
| JP | 2008-147509 A | 6/2008 |
| JP | 2011-185914 A | 9/2011 |

* cited by examiner

*Primary Examiner* — Tung X Nguyen
*Assistant Examiner* — Feba Pothen
(74) *Attorney, Agent, or Firm* — Allen & Overy LLP

(57) ABSTRACT

A chip package according to one embodiment includes a magnetic field sensor and a chip housing. The chip housing is a rectangular parallelepiped body. A solenoid coil is wound around four outer surfaces of the chip housing. The magnetic field sensor is disposed in the chip package. A plurality of first electrode pads connected to the solenoid coil and a plurality of second electrode pads connected to the magnetic field sensor are disposed on one mounting surface.

6 Claims, 4 Drawing Sheets

CHIP PACKAGE

CROSS-REFERENCE TO RELATED APPLICATION

This application is based upon and claims the benefit of priority from the prior Japanese Patent Application No. 2020-008083 filed on Jan. 22, 2020; the entire contents of which are incorporated herein by reference.

FIELD

Embodiments described herein relate generally to a chip package.

BACKGROUND

In a current detection device of a magnetic field detection type, when a current to be detected flows through a coil, a magnetic field is generated in the coil. The current detection device detects the current by detecting the magnetic field by a magnetic field sensor. To enhance detection sensitivity of the current detection device, it is effective to increase the number of turns of the coil.

It is possible to manufacture a solenoid coil having a large number of turns of coil by connecting a plurality of lower layer conductive lines and a plurality of upper layer conductive lines of a multi-layered printed wiring board to each other via respective through holes.

DETAILED DESCRIPTION

According to embodiments, a chip package includes a magnetic field sensor and a chip housing which is a rectangular parallelepiped body. A solenoid coil is wound around four outer surfaces of the chip housing, and the magnetic field sensor is disposed in the chip housing. A plurality of first electrode pads connected to the solenoid coil and a plurality of second electrode pads connected to the magnetic field sensor are disposed on one mounting surface of the chip housing.

First Embodiment

Hereinafter, a chip package 1 according to a first embodiment is described in detail with reference to drawings.

Drawings based on the respective embodiments are schematic views. Accordingly, a relationship between a thickness and a width of each member, and a ratio between thicknesses, a relative angle and the like of respective members differ from the corresponding relationships of members of an actual chip package. Portions of the chip package are described with different size relationship or different ratios between the drawings. Some components are not illustrated or symbols are not given to some components.

The chip package 1 is a current detection device configured to detect a current. The chip package 1 is used as, a high frequency switching power source such as a PFC power source, an AC/DC adopter, a control device of an inverter or a motor variable speed equipment, or a power module. However, the chip package 1 is not limited to such applications.

Figure 1:
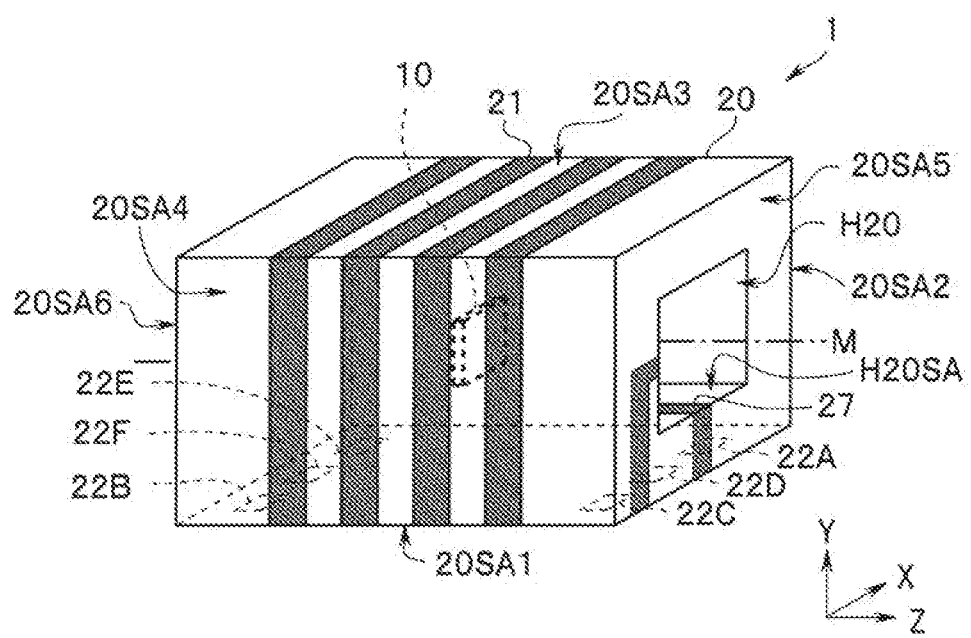
FIG. 1 is a perspective view of a chip package according to a first embodiment.
Figure 2:
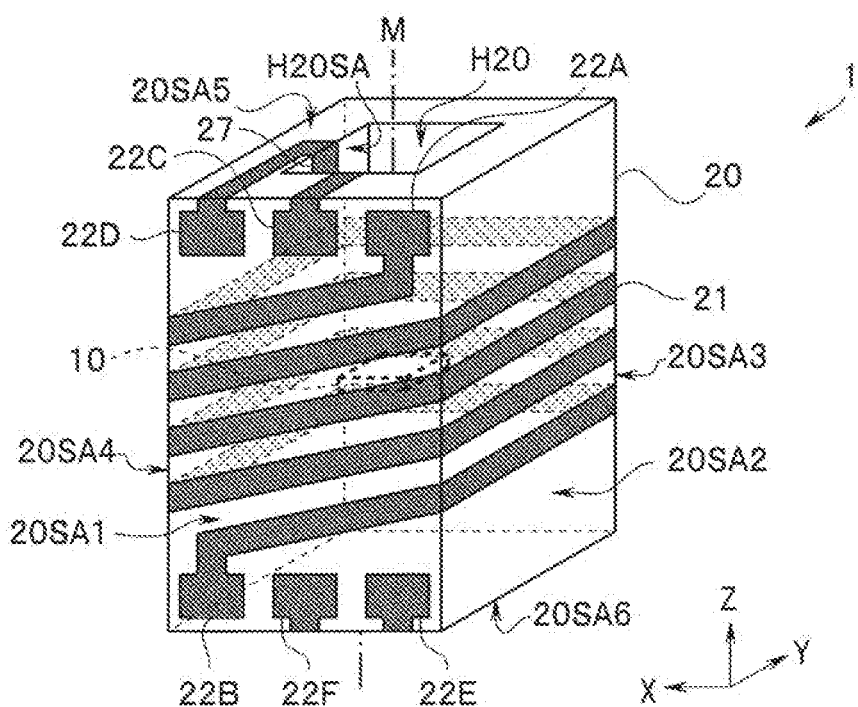
FIG. 2 is a perspective view for describing a configuration of a coil of the chip package according to the first embodiment.

As shown in FIG. 1 and FIG. 2, the chip package 1 includes a Hall element 10 which is a magnetic field sensor, and a chip housing (chip case) 20 which is a rectangular parallelepiped body.

In the embodiment, the chip housing 20 is a molded interconnect device (MID) where a wiring pattern is formed on a resin molded product. For example, in the chip housing 20, a wiring pattern is disposed by a plating method on a surface of a resin formed by injection molding using a mold.

In the chip housing 20, a solenoid coil 21 which is a wiring pattern is helically wound around four outer surfaces 20SA1 to 20SA4. The solenoid coil 21 is, for example, a thin film coil formed of a copper plated film. The solenoid coil 21 is smaller than a solenoid coil formed by winding a conductive wire, and can be easily manufactured. A magnetic field generated in the solenoid coil 21 is uniform, and a magnetic field direction M of the solenoid coil is in a winding direction of a coil (Z axis direction in the drawing).

The coil where the number of turns is N (N turn coil: N being an integer) exhibits an electric resistance R N times as large as a coil where the number of turns is one (one turn coil). However, the N turn coil generates a magnetic field N times as large as a magnetic field of one turn coil when the same current flows. A magnetic field intensity is proportional to a product of the number of turns N and a current I. Conversely, to generate a magnetic field B having the same intensity as the magnetic field of one turn coil, it is sufficient that a current I which is supplied to the N turn coil is 1/N of a current I which is supplied to the one turn coil.

A heat value (loss) P, a current I, and a resistance R of a coil have a relationship expressed by a following (equation 1).

$$P = I^2 R \qquad \text{(equation 1)}$$

Accordingly, although a coil having a large number of turns has a higher resistance R than a coil having a small number of turns, the coil having a large number of turns can decrease a current I and hence, the coil having a large number of turns has a small heat value (loss) P. Accordingly, the coil having a large number of turns is particularly effective when used as a coil through which a large current flows.

Further, the solenoid coil 21 having no through hole connecting portion exhibits a low resistance R and hence, a loss is small whereby the solenoid coil 21 exhibits high performance.

The Hall element 10 is configured to detect a current which flows through the solenoid coil 21. A current to be detected is a direct current or an alternating current.

When a current is supplied to the Hall element 10 so that a magnetic field is applied in a direction orthogonal to the direction of the current, a carrier which carries a current is affected by a Lorentz force. The Lorentz force generates a voltage (Hall voltage) in the direction orthogonal to the direction of a current and a magnetic field. The Hall element 10 is configured to detect a magnetic field by detecting the Hall voltage. The Hall voltage is increased in proportion to the magnetic field intensity.

Figure 3:
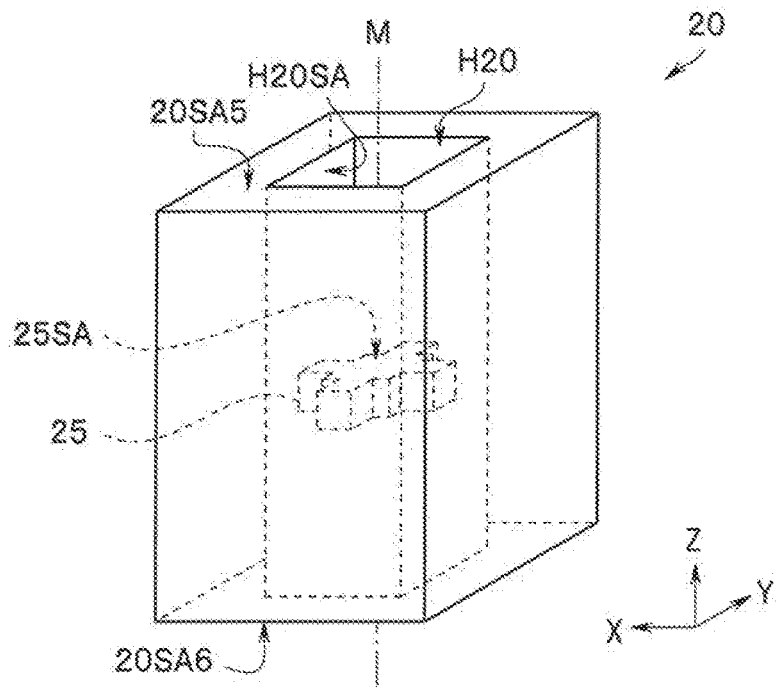
FIG. 3 is a perspective view for describing a chip housing of the chip package according to the first embodiment.
Figure 4:
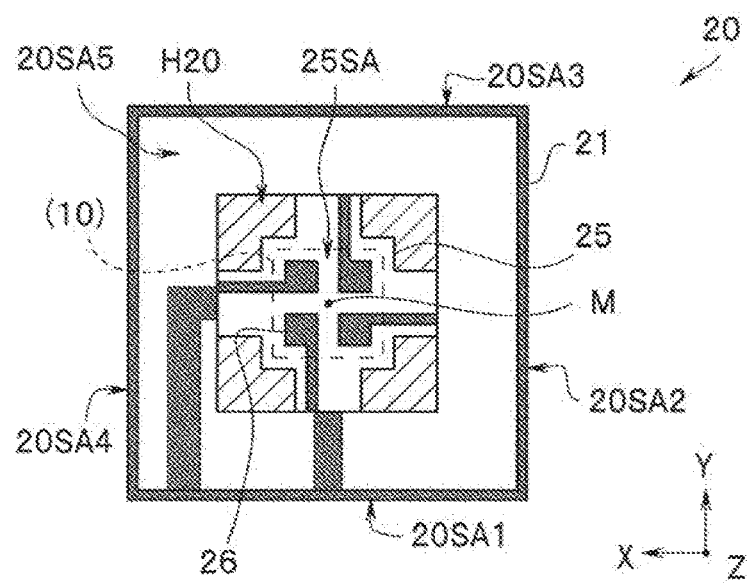
FIG. 4 is a top plan view for describing the chip housing of the chip package according to the first embodiment.

As shown in FIG. 3 and FIG. 4, in the embodiment, the chip housing 20 has a hole H20 having openings on two respective outer surfaces 20SA5, 20SA6 disposed orthogonal to four outer surfaces 20SA1 to 20SA4 around which the solenoid coil 21 is wound. In FIG. 3, the solenoid coil 21 and the like are not shown. Hatched regions shown in FIG. 4 indicate spaces which penetrate from the outer surface 20SA5 to the outer surface 20SA6, and wires 27 disposed on wall surfaces of the hole H20 (see FIG. 1, FIG. 2) are not shown.

The hole H20 is formed in the direction M of the magnetic field generated in the solenoid coil 21. A sensor attaching portion 25 is disposed in the hole H20. The sensor attaching portion 25 is supported by four beams which extend from the wall surfaces of the hole H20.

The Hall element 10 is mounted on an attaching surface 25SA, disposed perpendicular to the magnetic field direction M, of the sensor attaching portion 25. In other words, a plurality of external electrodes (not shown) of the Hall element 10 are joined to a plurality of electrode pads 26 of the sensor attaching portion 25.

Both first electrode pads 22A, 22B connected to end portions of the solenoid coil 21 and second electrode pads 22C to 22F connected to the Hall element 10 are disposed on the outer surface 20SA1 which is a mounting surface of the chip housing 20.

Four wires 27 which connect the Hall element 10 and four second electrode pads 22C to 22F to each other are disposed on the wall surfaces H20SA of the hole H20. The wire 27 is a thin film wire made of a copper plated film, for example.

The mounting surface is any one of four outer surfaces 20SA1 to 20SA4 around which the solenoid coil 21 is wound. In other words, the chip package 1 is a surface mounting type chip part where all electrode pads 22A to 22F for external connection are disposed on one outer surface.

The first electrode pads 22A, 22B and the second electrode pads 22C to 22F each are formed, for example, by arranging a solder layer on an end portion of the solenoid coil 21 made of copper via a barrier nickel layer.

In the chip package 1 according to the embodiment, a magnetic field which the solenoid coil 21 wound plural times generates is detected and hence, the chip package 1 is a high performance chip package having high detection sensitivity. Further, the Hall element 10 is mounted on the attaching surface 25SA disposed perpendicular to the magnetic field direction M in the chip housing 20 around the outer surface of which the solenoid coil 21 is wound and hence, the chip package 1 can be manufactured easily. Further, the chip package 1 is miniaturized and is a surface mounting type chip part and hence, the degree of freedom in arranging the chip package 1 on a printed wiring board is high whereby the chip package 1 can be easily mounted.

Modification of First Embodiment

The chip housing 20 according to the first embodiment is a completely rectangular parallelepiped body having the four outer surfaces 20SA1 to 20SA4 around which the solenoid coil 21 is wound and the outer surfaces 20SA5, 20SA6 disposed orthogonal to the outer surfaces 20SA1 to 20SA4. However, the chip housing may be a substantially rectangular parallelepiped body where at least one of border lines (corner portions) of the outer surfaces 20SA1 to 20SA4 around which the solenoid coil 21 is wound is chamfered so as to form a straight line or a curved line. In other words, "rectangular parallelepiped body" in the present invention does not mean a completely rectangular parallelepiped body. In the chamfered chip housing, the solenoid coil 21 is hard to break at the corner portion. Accordingly, such a chip housing can be easily manufactured with high reliability.

Figure 5:
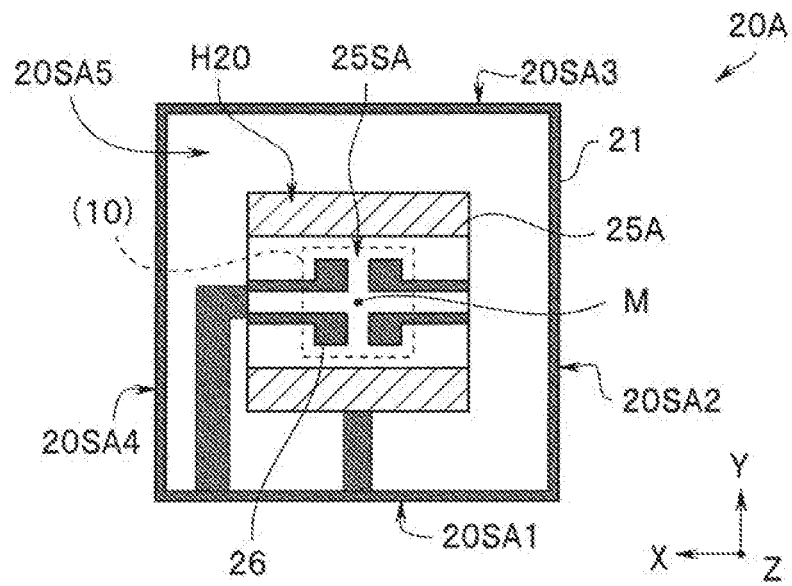
FIG. 5 is a top plan view for describing a chip housing of a chip package according to a modification of the first embodiment.

A sensor attaching portion 25A of a chip housing 20A according to a modification shown in FIG. 5 is supported by two beams extending from wall surfaces of a hole H20.

Figure 6:
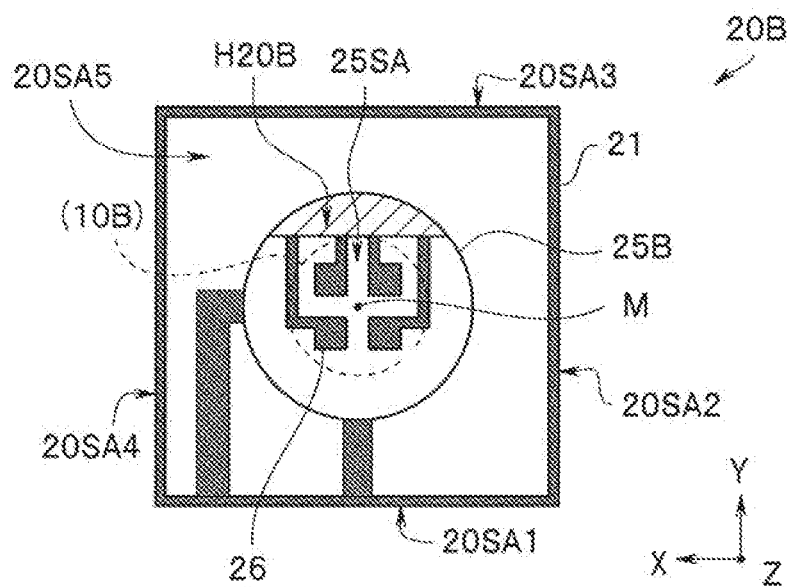
FIG. 6 is a top plan view for describing a chip housing of a chip package according to a modification of the first embodiment.

A sensor attaching portion 25B of a chip housing 20B according to a modification shown in FIG. 6 is disposed such that a through hole remains in a portion of a wall surface of a cylindrical hole H. A detection surface of a Hall element 10B in a direction perpendicular to a magnetic field direction M has a circular shape. In other words, the shape of the sensor attaching portion and the shape of the Hall element are not particularly limited.

A magnetic field in the solenoid coil 21 is uniform and hence, a center axis of the magnetic field and the center of the Hall element 10 may not agree with each other.

The number of electrode pads 26 of the sensor attaching portion 25B, that is, the number of electrodes of the Hall element is not limited to four. An outer surface of the chip package 1 except for regions of electrode pads 22A to 22F for external connection may be covered by an insulating resin. A resin may be filled in the hole H20 after the Hall element 10 is mounted on an attaching surface 25SA.

Second Embodiment

A chip package 1A according to a second embodiment is similar to the chip package 1. Accordingly, components having the same functions are affixed with the same symbols, and the explanation of such components is omitted.

Figure 7:
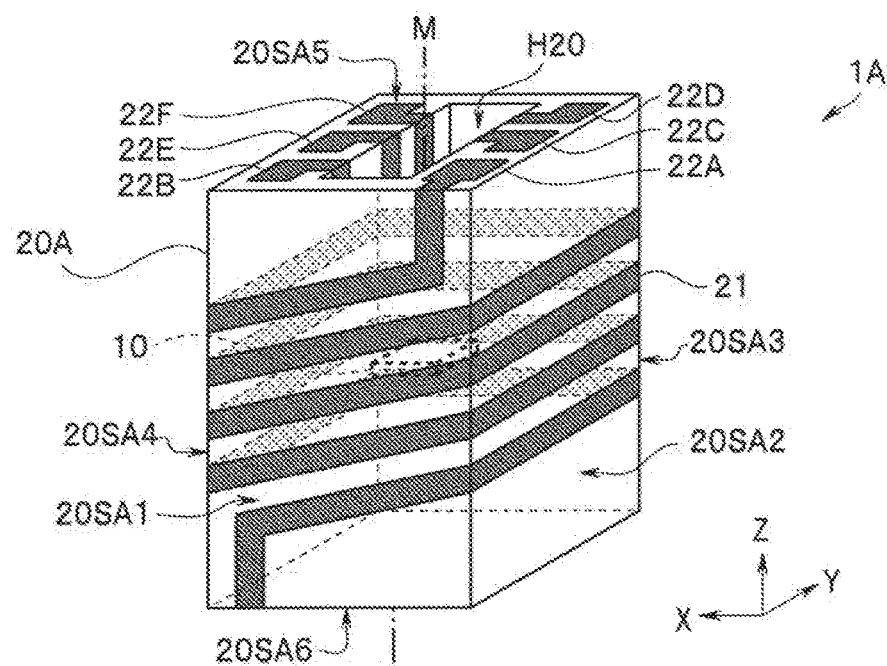
FIG. 7 is a perspective view of a chip package according to a second embodiment.

In the chip package 1A shown in FIG. 7, a mounting surface of a chip housing 20A on which first electrode pads 22A, 22B and second electrode pads 22C to 22F are disposed is an outer surface 20SA5 disposed orthogonal to four outer surfaces 20SA1 to 20SA4 around which a solenoid coil 21 is wound. The first electrode pad 22B and the solenoid coil 21 are connected to each other by a wire 27 disposed on wall surfaces of the hole H20. The wire may be disposed on the outer surfaces of the chip housing 20A.

In the chip package 1A, in the same manner as the chip package 1, all electrode pads 22A to 22F for external connection are disposed on any one of outer surfaces and hence, the chip package 1A can be mounted on a wiring board by surface mounting. The number of the electrode pads for external connection in the chip package is not limited to six, and may be less than six or more than six.

Third Embodiment

A chip package 1B according to a third embodiment is similar to the chip package 1. Accordingly, components having the same functions are affixed with the same symbols, and the explanation of such components is omitted.

Figure 8:
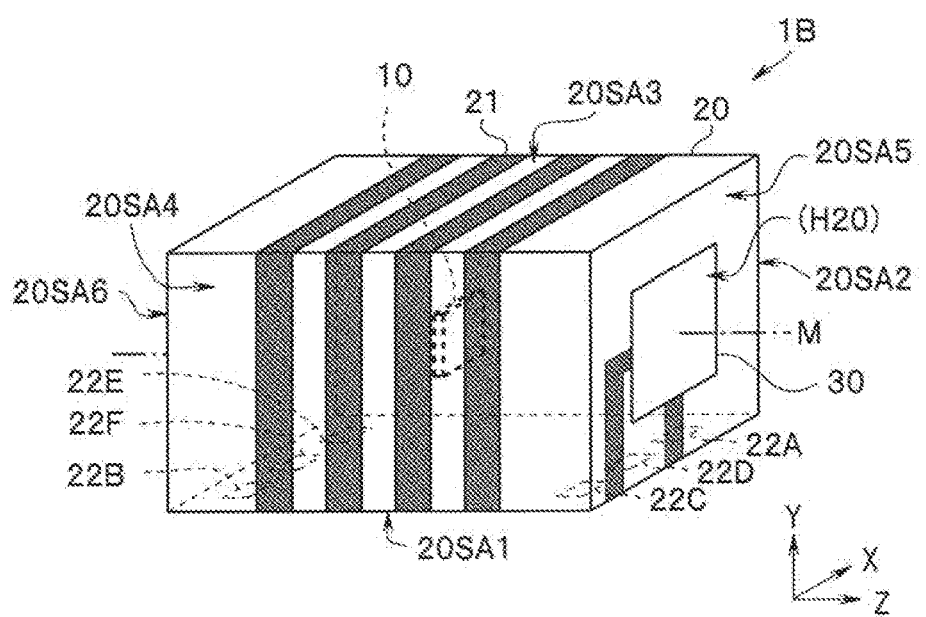
FIG. 8 is a perspective view of a chip package according to a third embodiment.

In the chip package 1B shown in FIG. 8, a resin 30 which contains a soft magnetic powder is filled in a hole H20. Magnetic field strength (magnetic flux density: B) which a solenoid coil 21 generates is proportional to internal magnetic permeability $\mu$. For example, the solenoid coil 21 in which the resin 30 containing the soft magnetic powder made of ferrite is filled generates a larger magnetic field B than the solenoid coil 21 which is hollow or is filled with a resin only (magnetic field strength: H) (B=μH).

Accordingly, the chip package 1B is a chip package having high sensitivity and high efficiency compared to the chip package 1.

By filling the resin 30 which contains the soft magnetic powder in the hole H20 of the chip package 1A, the chip package 1A can also acquire the same advantageous effects as the chip package 1B.

According to the chip package of at least one of the embodiments or modifications described above, the solenoid coil is wound around four outer surfaces, the magnetic field sensor is disposed in the chip package, and all electrode pads for external connection are disposed on one mounting surface. Accordingly, it is possible to provide a miniaturized chip package having high performance.

The description has been made by taking an example where the Hall element is used as the magnetic field sensor. However, it goes without saying that a magneto-resistive sensor (MR sensor) may be used as the magnetic field sensor.

The description has been made by taking an example where the current detection device is used as the chip package. However, the chip packages 1, 1A, 1B are also used as an insulating coupler. In other words, a primary circuit which includes the solenoid coil 21 and a secondary circuit which includes the Hall element 10 are electrically insulated from each other.

Either one of the first electrode pads 22A, 22B which are connected to the solenoid coil 21 may be connected to a trans-reception circuit. In this case, the chip packages 1, 1A, 1B can also be used as an antenna.

The description has been made by taking an example where the chip housing is the chip package of the molded interconnect device. However, the chip housing may be formed by other manufacturing method, for example, by using a three dimensional printer. A material for forming the chip housing is not limited to a resin. For example, the chip housing may be formed using a magnetic material such as a ferrite, and a Hall element disposed in a hole may be connected with electrode pads mounted on a mounting surface by conductive wires.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A chip package comprising:
a magnetic field sensor; and
a chip housing being a rectangular parallelepiped body, wherein a solenoid coil is wound around four outer surfaces of the chip housing, the magnetic field sensor is disposed in the chip housing, and a plurality of first electrode pads which are connected to the solenoid coil and a plurality of second electrode pads which are connected to the magnetic field sensor are disposed on one mounting surface, wherein
a hole which extends in a magnetic field direction of the solenoid coil is formed in the chip housing,
the magnetic field sensor is mounted on an attaching surface of a sensor attaching portion disposed in the hole, the attaching surface being disposed perpendicular to the magnetic field direction, and
a plurality of wires which connect the magnetic field sensor and the plurality of second electrode pads to each other are disposed on a wall surface of the hole.

2. The chip package according to claim 1, wherein the mounting surface is any one of the four outer surfaces around which the solenoid coil is wound.

3. The chip package according to claim 1, wherein the mounting surface is an outer surface of the chip housing disposed orthogonal to the four outer surfaces around which the solenoid coil is wound.

4. The chip package according to claim 1, wherein the chip housing is a molded interconnect device.

5. The chip package according to claim 4, wherein a resin containing soft magnetic powder is filled in the hole.

6. The chip package according to claim 1, wherein the chip package is a current detection device which is configured to detect a current which flows through the solenoid coil.

* * * * *